United States Patent
Kim et al.

(10) Patent No.: US 9,406,864 B2
(45) Date of Patent: Aug. 2, 2016

(54) NANOGENERATOR COMPRISING BORON NITRIDE ATOMIC LAYER

(71) Applicant: RESEARCH & BUSINESS FOUNDATION SUNGKYUNKWAN UNIVERSITY, Suwon-si (KR)

(72) Inventors: Sang Woo Kim, Suwon-si (KR); Ju Hyuck Lee, Ansan-si (KR); Kang Hyuck Lee, Suwon-si (KR); Keun Young Lee, Suwon-si (KR); Jin Yeong Lee, Suwon-si (KR); Wan Chul Seung, Yongin-si (KR)

(73) Assignee: RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 530 days.

(21) Appl. No.: 13/955,145

(22) Filed: Jul. 31, 2013

(65) Prior Publication Data
US 2013/0313944 A1    Nov. 28, 2013

Related U.S. Application Data

(63) Continuation of application No. PCT/KR2012/000748, filed on Jan. 31, 2012.

(30) Foreign Application Priority Data

Jan. 31, 2011  (KR) .................. 10-2011-0009837
Jan. 31, 2012  (KR) .................. 10-2012-0009576

(51) Int. Cl.
H01L 41/18   (2006.01)
H01L 41/312  (2013.01)
H01L 41/29   (2013.01)
H01L 41/113  (2006.01)
B82Y 30/00   (2011.01)

(52) U.S. Cl.
CPC .............. *H01L 41/18* (2013.01); *H01L 41/113* (2013.01); *H01L 41/29* (2013.01); *H01L 41/312* (2013.01); *B82Y 30/00* (2013.01)

(58) Field of Classification Search
CPC ...................................................... H01L 41/18
USPC ....................................................... 310/339
See application file for complete search history.

(56) References Cited

U.S. PATENT DOCUMENTS 6,805,390  B2 *  10/2004  Nakayama ................ B25J 7/00
                                                   294/86.4
2011/0192016  A1 *  8/2011  Kang ..................... B82Y 30/00
                                                   29/592.1

(Continued)

FOREIGN PATENT DOCUMENTS

JP    2006-240942 A    9/2006
JP    2008-266101 A    11/2008
KR    10-2004-0043027 A    5/2004
KR    10-2010-0033964 A    3/2010

OTHER PUBLICATIONS

Corso, M., et al. Boron Nltride Nanomesh, Jan. 9, 2004, Science, vol. 303, p. 217-220.*

(Continued)

*Primary Examiner* — J. San Martin
(74) *Attorney, Agent, or Firm* — NSIP Law

(57) ABSTRACT

A nanogenerator and a method of manufacturing the same are provided. The nanogenerator includes a boron nitride atomic layer, and a first electrode and a second electrode disposed on the boron nitride atomic layer.

6 Claims, 5 Drawing Sheets

(56) References Cited

U.S. PATENT DOCUMENTS

| | | | |
|---|---|---|---|
| 2014/0291607 A1* | 10/2014 | Kim | H01L 29/1606 257/9 |
| 2014/0340172 A1* | 11/2014 | Bradley | H03H 3/04 333/187 |
| 2015/0167148 A1* | 6/2015 | Sutter | C23C 14/0647 428/213 |
| 2015/0181650 A1* | 6/2015 | Kim | H05B 3/0014 219/552 |
| 2016/0043370 A1* | 2/2016 | Hatta | H01M 2/145 307/10.1 |

OTHER PUBLICATIONS

Li Song, et al., Large Scale Growth and Characterization of Atomic Hexagonal Boron Nltride Layers, 2010 American Chemical Society, Nano Letters, 10, 3209-3215.*

Sang A. Han, et al., Hexagonal Boron Nitride Assisted growth of stoichiometric Al2O3 dielectric on Graphene for Triboelectric Nanogenerators, 2015, Nano Energy, 12. 556-566.*

\* cited by examiner

NANOGENERATOR COMPRISING BORON NITRIDE ATOMIC LAYER

CROSS-REFERENCE TO RELATED APPLICATIONS

This application is a continuation of International Application No. PCT/KR2012/000748 filed on Jan. 31, 2012, which claims priority to and the benefit of Korean Patent Application No. 10-2012-0009576, filed on Jan. 31, 2012, and Korean Patent Application No. 10-2011-0009837, filed on Jan. 31, 2011, in the Korean Intellectual Property Office, the entire disclosure of all of which are incorporated herein by reference for all purposes.

BACKGROUND

1. Field

The following description relates to a nanogenerator and a method of manufacturing the same, and to, for example, a nanogenerator using a hexagonal boron nitride (BN) atomic layer and a method of manufacturing the same.

2. Description of Related Art

With the recent advancement of nanotechnology, devices can be manufactured at a nanoscale. However, a large portion of batteries that is currently used occupy a large area, and thus limits the performance of and the ability to independently drive nanoscale devices. To drive the nanoscale devices without connecting the devices to large batteries, a technology for generating power in a nanoscale apparatus is desirable. Two literatures relating to nanoscale devices for generating power are described hereafter.

Non-patent Literature 1: Piezoelectric Nanogenerators based on Zinc Oxide Nanowire Arrays, by Zhong Lin Wang and Jinhui Song (Science 14 Apr. 2006: Vol. 312 no. 5771 pp. 242-246).

Non-patent Literature 2: Atomic Layers of Hybridized Boron Nitride and Graphene Domains, by Lijie Cil et al (Nature Materials 9, 430-435: 2010).

Non-patent Literature 1 examines a piezoelectric mechanism using a 1-dimensional zinc oxide (ZnO) nanostructure and describes the formation of a device using the piezoelectric mechanism.

In addition, Non-patent Literature 2 describes a technique of forming a hexagonal born nitride (BN) atomic layer using a chemical deposition process.

SUMMARY

In one general aspect, there is provided a nanogenerator including: a boron nitride atomic layer, a first electrode disposed on the boron nitride atomic layer, and a second electrode disposed on the boron nitride atomic layer, the second electrode spaced apart from the first electrode.

The boron nitride atomic layer may be a hexagonal boron nitride atomic layer.

The general aspect of the nanogenerator may further include a flexible substrate, the boron nitride atomic layer disposed on the flexible substrate.

In another general aspect, there is provided a method of manufacturing a nanogenerator, including: forming a boron nitride atomic layer on a substrate; and forming a first electrode and a second electrode on the boron nitride atomic layer to be spaced apart from each other.

The boron nitride atomic layer may be a hexagonal boron nitride atomic layer.

The forming of the boron nitride atomic layer on the substrate may involve:
forming a boron nitride atomic layer on a copper foil; forming a polymethyl methacrylate (PMMA) layer on the copper foil on which the boron nitride atomic layer is formed; removing the copper foil; transferring the boron nitride atomic layer and the PMMA layer to the substrate; and removing the PMMA layer.

The forming of the boron nitride atomic layer on the copper foil may be performed by a chemical vapor deposition (CVD) process using the copper foil as a metal catalyst and ammonia-borane ($NH_3$—$BH_3$) as a source.

The forming of the boron nitride atomic layer on the copper foil may be performed in an atmosphere containing an argon-hydrogen (Ar—$H_2$) gas mixture and performed using nitrogen gas as a carrier gas for transferring vaporized ammonia-borane.

In another general aspect, there is provided a nanogenerator that includes: a first electrode; a boron nitride atomic layer disposed on the first electrode; and a second electrode disposed on the boron nitride atomic layer.

The boron nitride atomic layer may be a hexagonal boron nitride atomic layer.

The general aspect of the nanogenerator may further include a substrate, the substrate being disposed on one side of the first electrode and the boron nitride atomic layer being disposed on another side of the first electrode.

In another general aspect, there is provided a method of manufacturing a nanogenerator, including: forming a boron nitride atomic layer on a first electrode; and forming a second electrode on the boron nitride atomic layer.

The boron nitride atomic layer may be a hexagonal boron nitride atomic layer.

The general aspect of the method may further involve forming the first electrode on a substrate before forming the boron nitride atomic layer on the first electrode.

The forming of the boron nitride atomic layer on the first electrode may involve: forming a hexagonal boron nitride atomic layer on a copper foil; forming a PMMA layer on the copper foil on which the boron nitride atomic layer is formed; removing the copper foil; transferring the boron nitride atomic layer and the PMMA layer to the first electrode; and removing the PMMA layer.

Other features and aspects may be apparent from the following detailed description, the drawings, and the claims.

Figure 1:
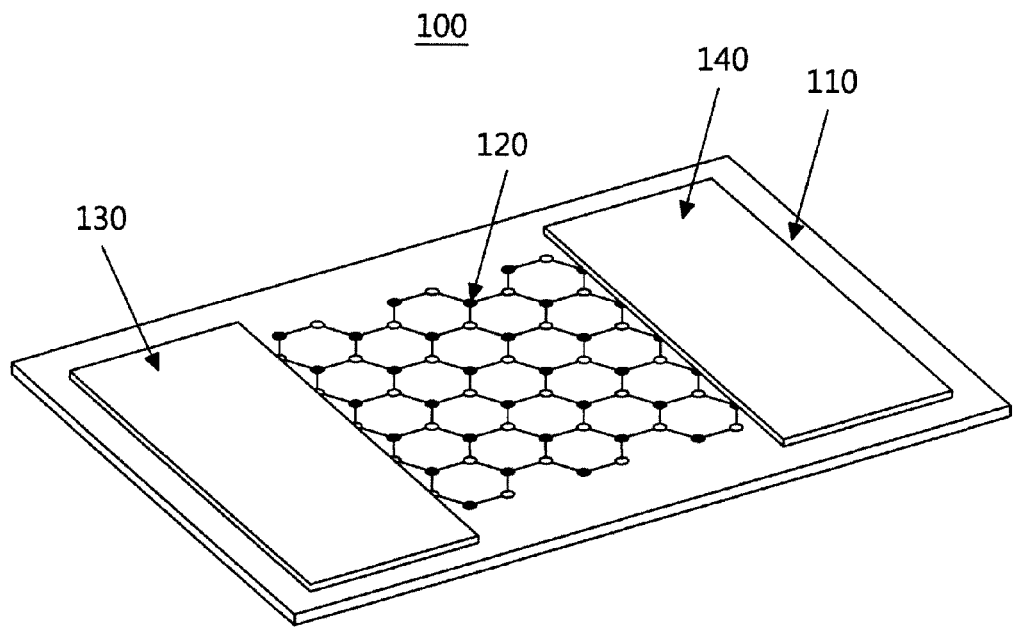
FIG. 1 is a perspective view of an example of a nanogenerator.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

A nanogenerator and a method of manufacturing the same according to various examples will be described in detail below with reference to the accompanying drawings. While the inventive concept is shown and described in connection with examples thereof, it will be apparent to those skilled in the art that various modifications can be made without departing from the spirit and scope of the disclosure. There is no intent to limit the disclosure to the particular forms illustrated. On the contrary, the disclosure is to cover all modifications, equivalents, and alternatives falling within the spirit and scope of the appended claims. In the drawings, the thicknesses of layers and regions may be exaggerated for clarity. Like reference numerals refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the inventive concept.

The terminology used herein to describe various examples is not intended to limit the scope of the disclosure. The articles "a," "an," and "the" are singular in that they have a single referent; however, the use of the singular form in the present document should not preclude the presence of more than one referent. In other words, elements referred to in the singular may number one or more, unless the context clearly indicates otherwise. It will be further understood that the terms "comprises," "comprising," "includes," and/or "including," when used herein, specify the presence of stated features, integers, steps, operations, elements, components, and/or groups thereof, but do not preclude the presence or addition of one or more other features, integers, steps, operations, elements, components, and/or groups thereof.

Described below are various examples of nanogenerators and methods of manufacturing the same.

As described above, Non-patent Literature 1 describes a nanogenerator that uses a 1-dimensional zinc oxide (ZnO) nanostructure. However, a nanogenerator that uses a 1-dimensional ZnO nanostructure is physically unstable in comparison to a nanogenerator that uses a 2-dimensional hexagonal boron nitride (BN) structure, and exhibits piezoelectric characteristics only due to compressive and tensile stresses.

In addition, Non-patent Literature 2 describes a technique of forming a hexagonal boron nitride (BN) atomic layer using a chemical deposition process. Non-patent Literature 2 is incorporated herein by reference. However, the piezoelectric characteristics caused by stretching and twisting the hexagonal boron nitride layer or a nano-device utilizing the piezoelectric characteristics are not mentioned therein.

Figure 2:
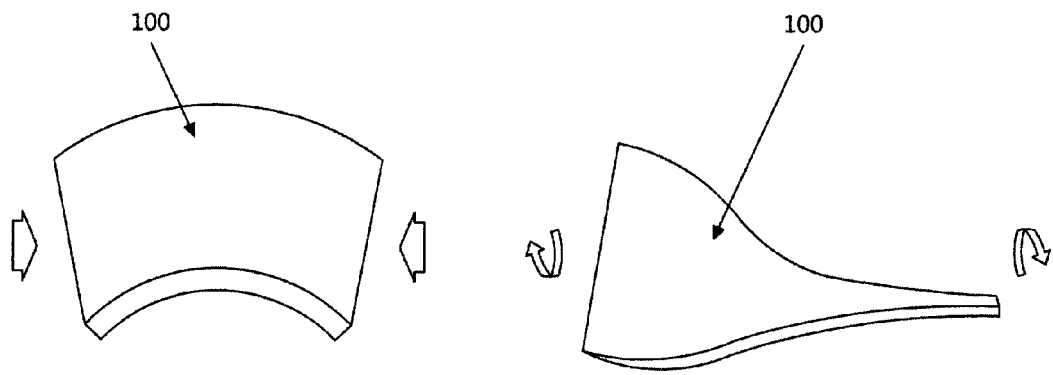
FIG. 2 is a perspective view of the nanogenerator of FIG. 1 that illustrates piezoelectric characteristics generated due to a variation in the atomic arrangement of the hexagonal boron nitride (BN) structure.
Figure 3:
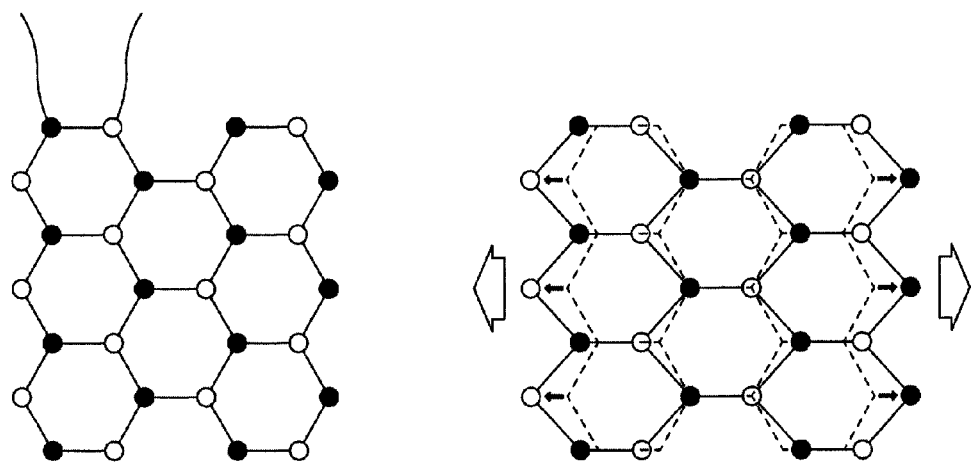
FIG. 3 is a molecular diagram illustrating piezoelectric characteristics generated due to a variation in the atomic arrangement of the hexagonal boron nitride (BN) caused by various physical forces.

Herein, examples of nanogenerators that include a boron nitride (BN) layer will be described with reference to FIGS. 1 through 3. FIG. 1 is a perspective view of an example of a nanogenerator 100 according to the present disclosure. FIG. 2 is a perspective view of the nanogenerator 100 of FIG. 1 that illustrates variations caused in piezoelectric characteristics due to the atomic arrangement of hexagonal boron nitride (BN). FIG. 3 illustrates a molecular structure of the hexagonal boron nitride (BN) under various physical forces to illustrate piezoelectric characteristics resulting from the atomic arrangement of hexagonal boron nitride (BN).

Referring to FIGS. 1 through 3, the nanogenerator 100 may include a substrate 110, a boron nitride layer 120, a first electrode 130, and a second electrode 140. The boron nitride layer 120 may be a hexagonal boron nitride layer, or a boron nitride atomic layer.

The substrate 110 may be a flexible substrate. In an example, the substrate 110 may be formed of a polymer capable of stretching, contracting, or bending. Examples of the polymer material that may be used to form the substrate 110 may be polyethylene naphthalate (PEN), polyethylene sulfonate (PES), and polyethylene terephthalate (PET).

The boron nitride atomic layer 120 may be disposed on a substrate 110. The boron nitride atomic layer 120 may have a single layer structure in which nitrogen (N) atoms and boron (B) atoms are combined in a hexagonal shape. The hexagonal boron nitride atomic layer 120 may exhibit stable chemical characteristics due to sp2 bonding. As shown in FIG. 2, when a physical force is applied to a hexagonal boron nitride atomic layer 120 and the hexagonal boron nitride atomic layer 120 is deformed, polarization of electric charges may occur due to the positional changes in nitrogen atoms and boron atoms in the chemical structure, and energy in the form of electricity may be generated due to the polarization. That is, the hexagonal boron nitride atomic layer 120 may exhibit piezoelectric characteristics so that the hexagonal boron nitride atomic layer 120 can be used to convert physical energy into electrical energy.

The first electrode 130 and the second electrode 140 may be disposed apart from each other on the hexagonal boron nitride atomic layer 120. The first and second electrodes 130 and 140 may have various shapes, such as a planar polygonal shape, a planar circular shape, and the like. In an example, when the hexagonal boron nitride atomic layer 120 has a rectangular planar shape, the first and second electrodes 130 and 140 may be respectively disposed at both ends of the substrate 110 according to a lengthwise direction or a widthwise direction of the substrate 110. As long as the first and second electrodes 130 and 140 are spaced apart from each other, the first and second electrodes 130 and 140 may be disposed in any positions on the hexagonal boron nitride atomic layer 120. In an example, the hexagonal boron nitride atomic layer 120 may be fixed to the substrate 110 by the first and second electrodes 130 and 140. In another example, the hexagonal boron nitride atomic layer 120 may be fixed to the substrate 110 by an adhesive member (not shown).

When a physical force is applied to the hexagonal boron nitride atomic layer 120, the first electrode 130 may transmit electrical energy, such as current or voltage, generated by the hexagonal boron nitride atomic layer 120. The first electrode 130 may be formed of a thin conductive material. The conductive material may include a transparent conductive material and/or an opaque conductive material. Examples of transparent conductive materials are graphene, indium tin oxide (ITO), indium zinc oxide (IZO), zinc oxide (ZnO), fluorine-doped tin oxide (FTO) and the like. Examples of opaque conductive materials include a metal, such as gold (Au), silver (Ag), or platinum (Pt).

When a physical force is applied to the hexagonal boron nitride atomic layer 120, the second electrode 140 may transmit the electrical energy in the form of current or voltage that is generated in the hexagonal boron nitride atomic layer 120. The second electrode 140 may be formed of a thin conductive material. A detailed description of the conductive material forming the second electrode 140 is substantially the same as that of the conductive material forming the first electrode 130. In addition, the first and second electrodes 130 and 140 may be formed of a flexible conductive material so that the hexagonal boron nitride atomic layer 120 can be easily bent or deformed. For instance, the first and second electrodes 130 and 140 may be formed of a conductive polymer.

Meanwhile, although not shown, an insulating layer may be provided on an exposed part of the hexagonal boron nitride atomic layer 120 on which the first and second electrodes 130 and 140 are not provided. The insulating layer may be interposed between the first and second electrodes 130 and 140 and may protect the exposed part of the hexagonal boron nitride atomic layer 120. Various insulating materials may be used to form the insulating layer. In this case, the insulating layer may have a height substantially lower than or equal to the height of the first and second electrodes 130 and 140.

As shown in FIG. 3, when an external physical force, such as stretching or twisting, is applied to the nanogenerator 100, the physical force may be also applied to the hexagonal boron nitride atomic layer 120 in the nanogenerator 100. Electrical energy may be generated in the hexagonal boron nitride atomic layer 120 due to the piezoelectric characteristics of the hexagonal boron nitride atomic layer 120. The electrical energy may be transmitted through the first and second electrodes 130 and 140 to the outside of the nanogenerator 100.

The nanogenerator 100 illustrated in FIG. 3 exhibits good mechanical stability. Thus, the nanogenerator 100 is not easily damaged due to an external force, by being bent, twisted, or rolled. Further, since the nanogenerator 100 uses the piezoelectric characteristics of the hexagonal boron nitride atomic layer 120 to generate electricity, the nanogenerator 100 may be driven continuously and independently, without a bulky external device. Also, since the nanogenerator 100 may be subminiature and ultrathin, the nanogenerator 100 may efficiently generate electrical energy using small physical energy, such as the wind, blood flow, or heartbeats. Furthermore, since the hexagonal boron nitride atomic layer 120 is chemically stable, the nanogenerator 100 may operate in the human body.

Figure 4:
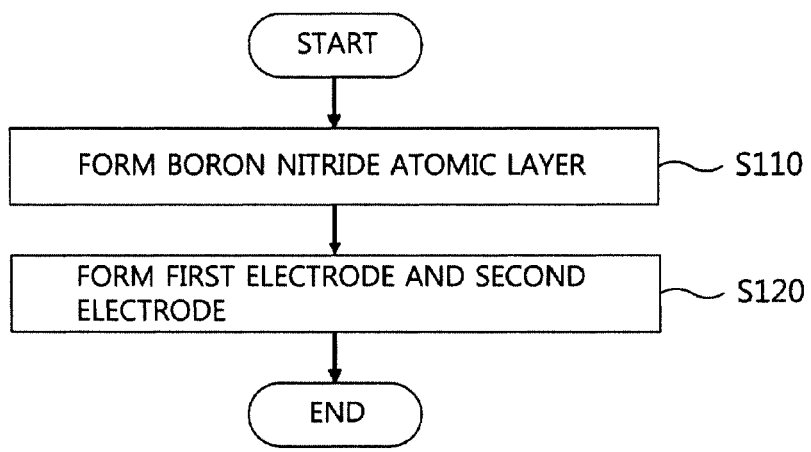
FIG. 4 is a flowchart illustrating a method of manufacturing the nanogenerator shown in FIG. 1.

FIG. 4 is a flowchart illustrating an example of a method of manufacturing the nanogenerator 100 shown in FIG. 1.

Referring to FIG. 4, in order to manufacture the nanogenerator 100, a hexagonal boron nitride atomic layer 120 may be formed on a substrate 110, as in S110.

The substrate 110 may be a flexible substrate. In an example, the substrate 110 may be formed of a polymer capable of stretching, contracting, or bending. Examples of the polymers that may be used to form the substrate 110 include PEN, PES, or PET.

The formation of the hexagonal boron nitride atomic layer 120 on the substrate 110 may include forming the hexagonal boron nitride atomic layer 120 on a copper (Cu) foil using a chemical deposition process and then forming the hexagonal boron nitride atomic layer 120 on the substrate 110 using a wet transfer process.

Figure 5:
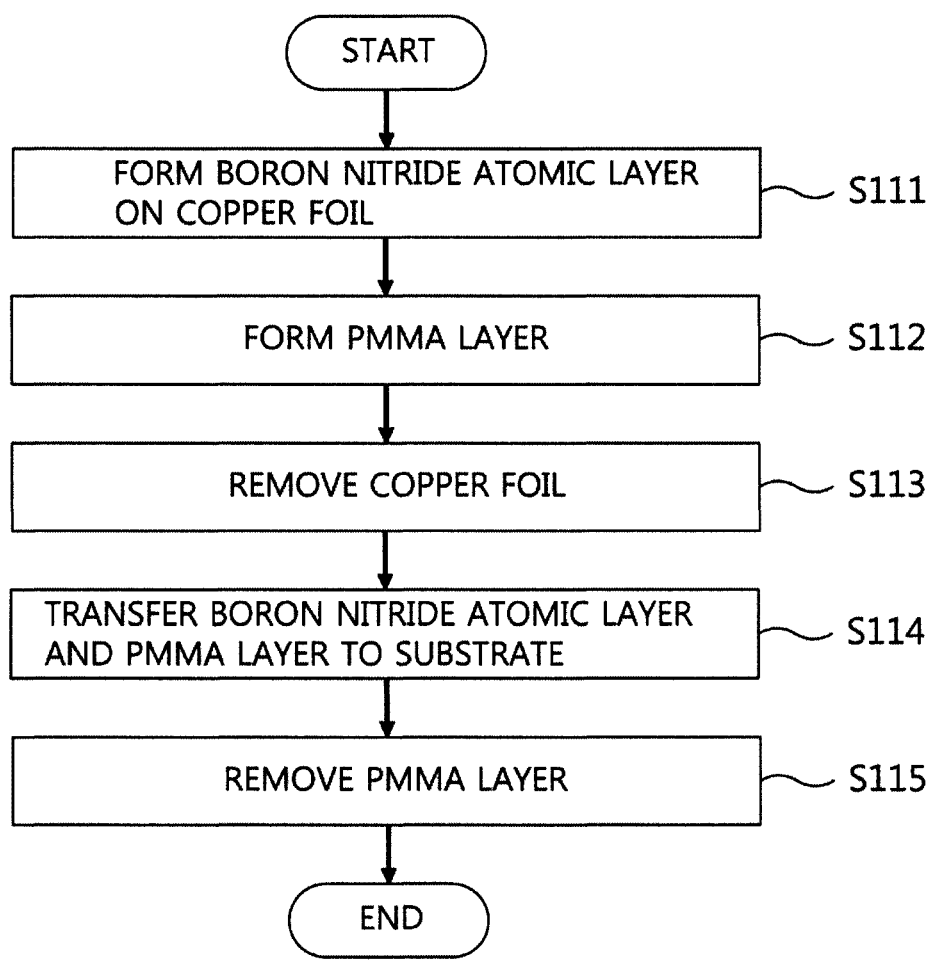
FIG. 5 is a flowchart illustrating a process of forming the hexagonal boron nitride atomic layer shown in FIG. 4.

FIG. 5 is a flowchart illustrating an example of a process of forming the hexagonal boron nitride atomic layer 120 shown in FIG. 4.

Referring to FIG. 5, to form a hexagonal boron nitride atomic layer 120 on a substrate 110, initially, the hexagonal boron nitride atomic layer 120 may be formed on a copper foil, as in S111.

The hexagonal boron nitride atomic layer 120 may be formed via a chemical vapor deposition (CVD) process using the copper foil as a metal catalyst and using ammonia-borane ($NH_3$—$BH_3$) as a source. For example, vaporized ammonia-borane and nitrogen gas may be supplied in the atmosphere containing an argon-hydrogen (Ar—$H_2$) gas mixture to form the hexagonal boron nitride atomic layer 120 on the copper foil. The hexagonal boron nitride atomic layer 120 may have a single layer structure in which nitrogen atoms and boron atoms are combined in a hexagonal shape.

When the hexagonal boron nitride atomic layer 120 is formed on the copper foil, polymethyl methacrylate (PMMA) may be coated on the copper foil having the hexagonal boron nitride atomic layer 120 to form a PMMA layer, as in S112.

The PMMA layer may be coated on the copper foil using a spin coating process. The PMMA layer may surround the hexagonal boron nitride atomic layer 120. Accordingly, the PMMA layer may function as a support layer configured to support the hexagonal boron nitride atomic layer 120.

Subsequently, the copper foil may be removed, as in S113.

For example, the copper foil may be selectively removed using a copper etchant. Thereafter, the copper etchant remaining on surfaces of the hexagonal boron nitride atomic layer 120 and the PMMA layer may be cleaned using deionized water (DIW).

Next, the hexagonal boron nitride atomic layer 120 and the PMMA layer may be transferred to the substrate 110, as in S114.

The DIW remaining on the hexagonal boron nitride atomic layer 120 and the PMMA layer transferred to the substrate 110 may be completely dried.

Next, the PMMA layer may be removed, as in S115.

The PMMA layer may be selectively removed using an organic solvent, such as acetone or chloroform. When the PMMA layer is removed, the hexagonal boron nitride atomic layer 120 may be formed on the substrate 110.

The hexagonal boron nitride atomic layer 120 may be chemically stable due to $sp^2$ bonding in a 2-dimensional structure. When a physical force is applied to the hexagonal boron nitride atomic layer 120 and deforms the layer, polarization may occur due to the positional changes in the nitrogen atoms and boron atoms. Electrical energy may be generated due to the polarization. That is, the hexagonal boron nitride atomic layer 120 may exhibit piezoelectric characteristics, so that the hexagonal boron nitride atomic layer 120 can be used to convert physical energy into electrical energy.

Referring back to FIG. 4, a first electrode 130 and a second electrode 140 may be formed on the hexagonal boron nitride atomic layer 120, and the first electrode 130 and the second electrode 140 may be spaced apart from each other in a plane parallel to the hexagonal boron nitride atomic layer 120, during S120.

The first and second electrodes 130 and 140 may be formed using a thin layer forming process. Examples of thin layer forming processes that may be used include a sputtering process, a CVD process, or an inkjet printing process. The first and second electrodes 130 and 140 may be formed of a thin conductive material. The conductive material may include a transparent conductive material and/or an opaque conductive material. Examples of the transparent conductive materials include graphene, ITO, IZO, ZnO, FTO and the like. Examples of the opaque conductive materials include a metal, such as gold, silver, or platinum.

In an example, the first electrode 130 and the second electrode 140 may be formed simultaneously. For example, conductive layers may be formed apart from one another on the hexagonal boron nitride atomic layer 120 using a thin layer forming process without an additional mask so that the first and second electrodes 130 and 140 can be formed simultaneously. Also, a mask pattern configured to divide the hexagonal boron nitride atomic layer 120 into two portions may be formed, a thin conductive layer may be formed using a thin layer forming process on the hexagonal boron nitride atomic layer 120 having the mask pattern, and the mask pattern may be removed to form the first electrode 130 and the second electrode 140. Furthermore, after forming a thin conductive layer on the hexagonal boron nitride atomic layer 120 using a thin layer forming process, a central portion of the conductive layer may be etched to divide the conductive layer into two portions so that the first and second electrodes 130 and 140 can be formed.

In another example, the first and second electrodes 130 and 140 may be sequentially formed. For example, after the first electrode 130 is initially formed on the hexagonal boron nitride atomic layer 120 using a thin layer forming process, the second electrode 140 may be formed on the hexagonal boron nitride atomic layer 120 to be spaced apart from the first electrode 130.

Meanwhile, although not shown, an insulating layer may be provided on the hexagonal boron nitride atomic layer 120 exposed between the first and second electrodes 130 and 140. In this case, the insulating layer may have a height substantially lower than or equal to the height of the first and second electrodes 130 and 140.

Accordingly, the nanogenerator 100 including the substrate 110, the hexagonal boron nitride atomic layer 120, the first electrode 130, and the second electrode 140 may be completed.

Since the nanogenerator 100 that is formed using the above-described method has good mechanical stability, the nanogenerator 100 may is prevented from being damaged by, for example, being bent, twisted, or rolled, when an external force is applied thereto. Further, because the nanogenerator 100 uses the piezoelectric characteristics of the hexagonal boron nitride atomic layer 120, the nanogenerator 100 may be driven continuously and independently of other devices. Also, since the nanogenerator 100 may be made subminiature and ultrathin, the nanogenerator 100 may efficiently generate electrical energy using small physical energy, such as the wind, blood flow, or heartbeats. Furthermore, since the hexagonal boron nitride atomic layer 120 is chemically stable, the nanogenerator 100 may be installed and operated in the human body.

Figure 6:
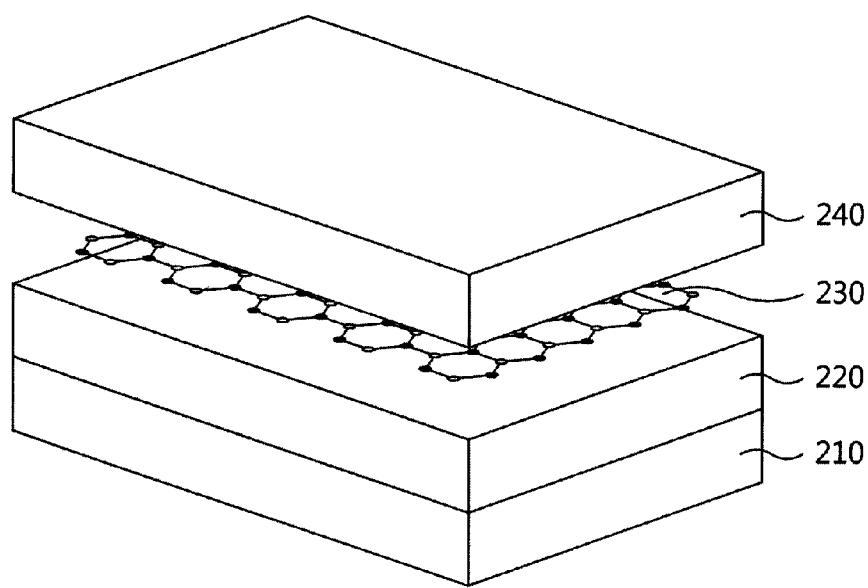
FIG. 6 is a perspective view of another example of a nanogenerator.
Figure 7:
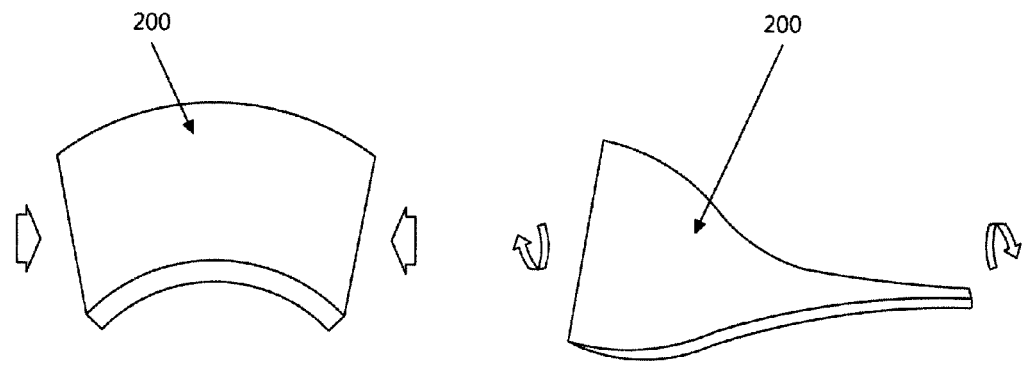
FIG. 7 is a perspective view of the nanogenerator of FIG. 6 in a driving state under various physical forces.

FIG. 6 is a perspective view of a nanogenerator 200 according to another example, and FIG. 7 is a perspective view of the nanogenerator 200 of FIG. 6 in a driving state under various external physical forces.

Referring to FIGS. 6 and 7, the nanogenerator 200 may include a substrate 210, a first electrode 220, a hexagonal boron nitride atomic layer 230, and a second electrode 240.

The substrate 210 may be a flexible substrate. In an example, the substrate 210 may be formed of a polymer capable of stretching, contracting, or bending. Examples of polymers that may be used in the substrate 210 include PEN, PES, or PET.

The first electrode 220 may be disposed on the substrate 210. When a physical force is applied to the hexagonal boron nitride atomic layer 230, the first electrode 220 may transmit electrical energy, such as current and voltage, generated by the hexagonal boron nitride atomic layer 230. The first electrode 220 may be formed of a thin conductive material. The conductive material may include a transparent conductive material and/or an opaque conductive material. Examples of transparent conductive materials that may be used include graphene, ITO, IZO, ZnO, or FTO. Examples of opaque conductive materials that may be used include, for instance, a metal, such as gold, silver, or platinum.

The hexagonal boron nitride atomic layer 230 may be disposed on the first electrode 220. The hexagonal boron nitride atomic layer 230 may have a single layer structure in which nitrogen atoms and boron atoms are combined in a hexagonal shape. The hexagonal boron nitride atomic layer 230 may exhibit stable chemical characteristics due to sp2 bonding. When a physical force is applied to the hexagonal boron nitride atomic layer 230 and deforms the atomic arrangement, polarization may occur due to the positional changes of the nitrogen atoms and boron atoms in the layer 230, and electrical energy may be generated due to the polarization. That is, the hexagonal boron nitride atomic layer 230 may exhibit piezoelectric characteristics, so that the hexagonal boron nitride atomic layer 230 may be used to convert physical energy into electrical energy.

The second electrode 240 may be disposed on the hexagonal boron nitride atomic layer 230. Like the first electrode 220, when a physical force is applied to the hexagonal boron nitride atomic layer 230, the second electrode 240 may transmit electrical energy such as current and voltage that may be generated by the hexagonal boron nitride atomic layer 230. The second electrode 240 may be formed of a thin conductive material. The conductive material may include a transparent conductive material and/or an opaque conductive material. Examples of the transparent conductive materials include graphene, ITO, IZO, ZnO, FTO and the like. Examples of the opaque conductive materials include a metal, such as gold, silver, or platinum.

As shown in FIG. 7, when an external physical force, such as stretching or twisting, is applied to the nanogenerator 200, the physical force may be also applied to the hexagonal boron nitride atomic layer 230 in the nanogenerator 200. Electrical energy may be generated in the hexagonal boron nitride atomic layer 230 due to the piezoelectric characteristics of the hexagonal boron nitride atomic layer 230. The electrical energy may be transmitted through the first and second electrodes 220 and 240 and to the outside of the nanogenerator 200.

Because the nanogenerator 200 has excellent mechanical stability, the nanogenerator 200 is prevented from being damaged by, for example, benting, twisting, or rolling, when an external force is exerted thereto. Since the nanogenerator 200 uses the piezoelectric characteristics of the hexagonal boron nitride atomic layer 230, the nanogenerator 200 may be driven continuously and independently. Also, since the nanogenerator 200 may be subminiature and ultrathin, the nanogenerator 200 may efficiently generate electrical energy using small physical energy, such as the wind, blood flow, or heartbeats. Furthermore, since the hexagonal boron nitride atomic layer 230 is chemically stable, the nanogenerator 200 may be installed and operated inside or on the human body.

Figure 8:
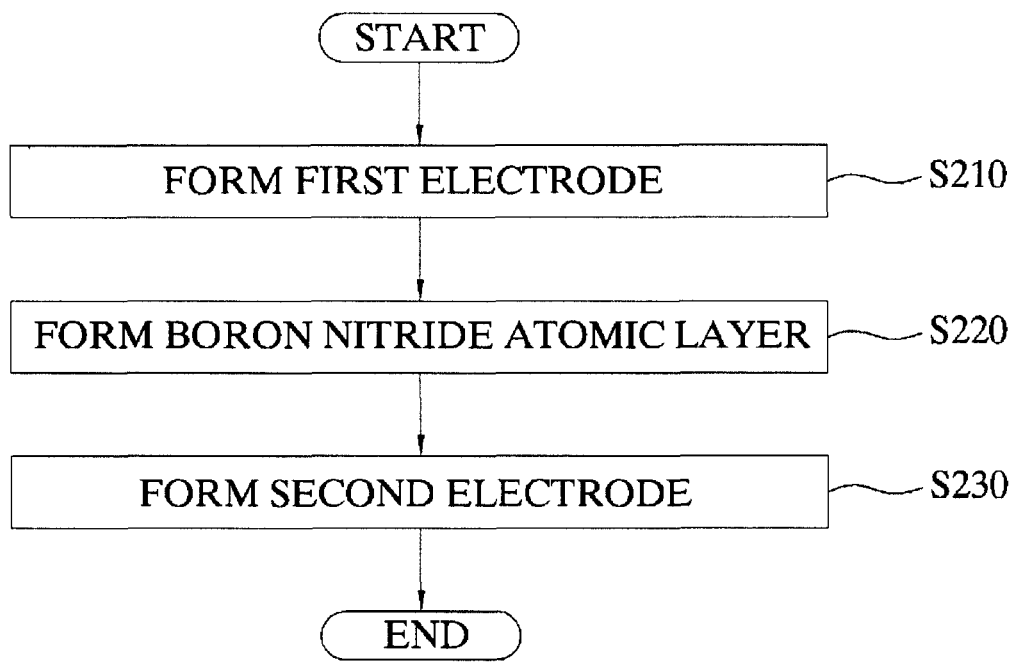
FIG. 8 is a flowchart illustrating a method of manufacturing the nanogenerator shown in FIG. 6.

FIG. 8 is a flowchart illustrating an example of a method of manufacturing the nanogenerator 200 shown in FIG. 6.

Referring to FIG. 6, to manufacture the nanogenerator 200, initially, a first electrode 220 may be formed on a substrate 210, as in S210.

The substrate 210 may be a flexible substrate. In an example, the substrate 210 may be formed of a polymer capable of stretching, contracting, or bending. Examples of polymer materials that may be used to form the substrate 210 include PEN, PES, PET and the like.

The first electrode 220 may be formed using a thin layer forming process. The thin layer forming processes that may be used include, for example, a sputtering process, a CVD process, an inkjet printing process and the like. The first electrode 220 may be formed of a thin conductive material. The conductive material may include a transparent conductive material and/or an opaque conductive material. Examples of the transparent conductive materials include graphene, ITO, IZO, ZnO, FTO and the like. Examples of the opaque conductive materials include a metal, such as gold, silver, or platinum.

As in S220, a hexagonal boron nitride atomic layer 230 may be formed on the first electrode 220.

The formation of the hexagonal boron nitride atomic layer 230 on the first electrode 220 may involve forming the hexagonal boron nitride atomic layer 230 on a copper foil using a chemical deposition process and then forming the hexagonal boron nitride atomic layer 230 on the substrate 210 using a wet transfer process.

Since the process of forming the hexagonal boron nitride atomic layer 230 on the first electrode 220 is substantially the same as the process of forming the hexagonal boron nitride atomic layer 120 on the substrate 110 described with reference to FIG. 5, a detailed description thereof is omitted.

The hexagonal boron nitride atomic layer 230 may exhibit stable chemical characteristics due to sp2 bonding. When a physical force is applied to the hexagonal boron nitride atomic layer 230 and deforms the hexagonal boron nitride atomic layer 230, polarization may occur due to positional changes in nitrogen atoms and boron atoms, and electrical energy may be generated due to the polarization. That is, the hexagonal boron nitride atomic layer 230 may exhibit piezoelectric characteristics, so that the hexagonal boron nitride atomic layer 230 may be used to convert physical energy into electrical energy.

Next, in S230, a second electrode 240 may be formed on the hexagonal boron nitride atomic layer 230.

Since the process of forming the second electrode 240 is substantially the same as the process of forming the first electrode 220, a detailed description thereof is omitted.

Accordingly, the formation of the nanogenerator 200 including the substrate 210, the first electrode 220, the hexagonal boron nitride atomic layer 230, and the second electrode 240 may be completed.

Because the nanogenerator 200 formed using the above-described method has good mechanical stability, the nanogenerator 200 is prevented from being damaged, for example, by being bent, twisted, or rolled, when an external force is applied thereto. Since the nanogenerator 200 uses the piezoelectric characteristics of the hexagonal boron nitride atomic layer 230, the nanogenerator 200 may be driven continuously and independently. Also, since the nanogenerator 200 may be made subminiature and ultrathin in scale, the nanogenerator 200 may efficiently generate electrical energy using small physical energy, such as the wind, blood flow, or heartbeats. Furthermore, since the hexagonal boron nitride atomic layer 230 is chemically stable, the nanogenerator 200 may be installed and operated in or on the human body.

As described above, various examples of nanogenerators were described. In an example, the nanogenerator includes a substrate, a hexagonal boron nitride atomic layer disposed on the substrate, a first electrode disposed on the hexagonal boron nitride atomic layer, and a second electrode disposed on the hexagonal boron nitride atomic layer and spaced apart from the first electrode. The substrate may be a flexible substrate.

In another example, a nanogenerator may be manufactured by: forming a hexagonal boron nitride atomic layer on a substrate, and forming a first electrode and a second electrode on the hexagonal boron nitride atomic layer to be spaced apart from each other. The forming of the hexagonal boron nitride atomic layer on the substrate may involve: forming a hexagonal boron nitride atomic layer on copper foil; forming a polymethyl methacrylate (PMMA) layer on the copper foil on which the hexagonal boron nitride atomic layer is formed, the PMMA layer configured to support the hexagonal boron nitride atomic layer; removing the copper foil; transferring the hexagonal boron nitride atomic layer and the PMMA layer to the substrate; and removing the PMMA layer. The hexagonal boron nitride atomic layer may be formed on the copper foil by a chemical vapor deposition (CVD) process using the copper foil as a metal catalyst and ammonia-borane ($NH_3$—$BH_3$) as a source. The hexagonal boron nitride atomic layer may be formed on the copper foil in an atmosphere containing an argon-hydrogen (Ar—$H_2$) gas mixture, using nitrogen gas as a carrier gas for transferring vaporized ammonia-borane.

In another example, a nanogenerator may include: a substrate; a first electrode disposed on the substrate; a hexagonal boron nitride atomic layer disposed on the first electrode; and a second electrode disposed on the hexagonal boron nitride atomic layer. In yet another example, a nanogenerator may be manufactured by: forming a first electrode on a substrate; forming a hexagonal boron nitride atomic layer on the first electrode; and forming a second electrode on the hexagonal boron nitride atomic layer. The hexagonal boron nitride atomic layer may be formed on the first electrode by: forming a hexagonal boron nitride atomic layer on copper foil; forming a PMMA layer on the copper foil on which the hexagonal boron nitride atomic layer is formed, the PMMA layer configured to support the hexagonal boron nitride atomic layer; removing the copper foil; transferring the hexagonal boron nitride atomic layer and the PMMA layer to the first electrode; and removing the PMMA layer.

An example of the nanogenerator exhibits good mechanical chemical stability and may be driven continuously and independently, utilizing the piezoelectric characteristics of a hexagonal boron nitride atomic layer. Also, since the nanogenerator can be made ultrathin and in a subminiature size, the nanogenerator can efficiently generate electrical energy using small physical energy. Furthermore, since the hexagonal boron nitride atomic layer is chemically stable, the nanogenerator can be installed or operated in or on the human body. Therefore, the nanogenerator can be employed as a small-sized energy source in various fields, such as mechanical, electronic, and/or medical fields.

In a nanogenerator and a method of manufacturing the same according to the above description, because a nanogenerator with high mechanical stability may be manufactured, the nanogenerator may not be prevented from being damaged by, for example, being bent, twisted, or rolled, when an external force is applied thereto. Further, because the nanogenerator uses the piezoelectric characteristics of a hexagonal boron nitride atomic layer, the nanogenerator can be driven continuously and independently. Further, the examples of nanogenerators described above may be produced ultrathin in a subminiature scale. Thus, the nanogenerator can efficiently generate electrical energy by utilizing small physical energy, such as the physical energy present in the wind, blood flow, or even heartbeats. Furthermore, since the hexagonal boron nitride atomic layer is chemically stable, the nanogenerator can be installed or operated on or within the human body.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A nanogenerator comprising:
   a boron nitride atomic layer;
   a first electrode disposed on the boron nitride atomic layer; and
   a second electrode disposed on the boron nitride atomic layer, the second electrode spaced apart from the first electrode.

2. The nanogenerator of claim 1, wherein the boron nitride atomic layer is a hexagonal boron nitride atomic layer.

3. The nanogenerator of claim 1, further comprising a flexible substrate, the boron nitride atomic layer disposed on the flexible substrate.

4. A nanogenerator comprising:
   a first electrode;
   a boron nitride atomic layer disposed on the first electrode; and
   a second electrode disposed on the boron nitride atomic layer.

5. The nanogenerator of claim 4, wherein the boron nitride atomic layer is a hexagonal boron nitride atomic layer.

6. The nanogenerator of claim 4, further comprising a substrate, the substrate being disposed on one side of the first electrode and the boron nitride atomic layer being disposed on another side of the first electrode.

* * * * *